United States Patent
Montgomery

(10) Patent No.: US 10,951,177 B1
(45) Date of Patent: Mar. 16, 2021

(54) RADIO FREQUENCY POWER LIMITER WITH REFLECTED POWER DETECTION

(71) Applicant: Rockwell Collins, Inc., Cedar Rapids, IA (US)

(72) Inventor: Byron J. Montgomery, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 21 days.

(21) Appl. No.: 16/432,552

(22) Filed: Jun. 5, 2019

(51) Int. Cl.
*H03F 1/52* (2006.01)
*H04B 1/18* (2006.01)
*H03F 3/189* (2006.01)
*H03G 11/00* (2006.01)

(52) U.S. Cl.
CPC .............. *H03F 1/52* (2013.01); *H03F 3/189* (2013.01); *H03G 11/002* (2013.01); *H04B 1/18* (2013.01)

(58) Field of Classification Search
CPC .................................... H03F 1/52; H03F 3/21
USPC ............................................ 330/298, 207 P
See application file for complete search history.

(56) References Cited

U.S. PATENT DOCUMENTS

| | | | | |
|---|---|---|---|---|
| 7,932,782 B2* | 4/2011 | Lau | ........................... | H03F 3/19 330/296 |
| 8,963,643 B2* | 2/2015 | Lautzenhiser | ............ | H03F 1/56 330/285 |
| 9,559,640 B2* | 1/2017 | Youssef | .................. | H03F 3/193 |
| 2018/0026591 A1* | 1/2018 | Rada | ....................... | H03F 3/193 330/294 |

* cited by examiner

*Primary Examiner* — Henry Choe
(74) *Attorney, Agent, or Firm* — Suiter Swantz pc llo

(57) ABSTRACT

A radio frequency (RF) power limiter includes an input direct current (DC) block, an output DC block, a limiter diode, a RF choke, and a test diode. A first terminal of the limiter diode is coupled to a node between the input DC block and the output DC block, and a second terminal of the limiter diode is coupled to an electrical ground. A first terminal of the RF choke is coupled to the node between the input DC block and the output DC block so that the first terminal of the RF choke is coupled to the first terminal of the limiter diode. A first terminal of the test diode is coupled to the second terminal of the RF choke, and a second terminal of the test diode is coupled to the electrical ground.

16 Claims, 6 Drawing Sheets

US 10,951,177 B1

RADIO FREQUENCY POWER LIMITER WITH REFLECTED POWER DETECTION

BACKGROUND

A radio frequency (RF) communication system may employ a RF power limiter to control (limit) power of RF signals propagated through the system. RF power limiters are difficult to test because of their DC characteristics. Existing built-in test (BIT) techniques require complex circuitry including one or more switches, which may occupy more space than the RF power limiter itself. Consequently, there is a need for RF power limiters with more robust/compact BIT circuitry.

SUMMARY

A radio frequency (RF) power limiter with built-in test (BIT) circuitry is disclosed. In one or more embodiments, the RF power limiter includes an input direct current (DC) block, an output DC block, a limiter diode, a RF choke, and a test diode. A first terminal of the limiter diode is coupled to a node between the input DC block and the output DC block, and a second terminal of the limiter diode is coupled to an electrical ground. A first terminal of the RF choke is coupled to the node between the input DC block and the output DC block so that the first terminal of the RF choke is coupled to the first terminal of the limiter diode. A first terminal of the test diode is coupled to the second terminal of the RF choke, and a second terminal of the test diode is coupled to the electrical ground.

In some embodiments of the RF power limiter, the input DC block includes at least one input capacitor, and the output DC block includes at least one output capacitor.

In some embodiments of the RF power limiter, the limiter diode is a PIN diode.

In some embodiments of the RF power limiter, the RF choke includes at least one inductor.

In some embodiments of the RF power limiter, the test diode is a Schottky diode.

In some embodiments of the RF power limiter, a forward voltage of the test diode is indicative of whether current is flowing through the limiter diode.

In some embodiments of the RF power limiter, the RF power limiter further includes a detection circuit configured to detect whether current is flowing through the limiter diode based on the forward voltage.

In some embodiments of the RF power limiter, the detection circuit includes an analog-to-digital converter (ADC) configured to quantize the forward voltage.

In some embodiments of the RF power limiter, the detection circuit includes an operational amplifier configured to generate an output signal based on the forward voltage.

In some embodiments of the RF power limiter, the detection circuit further includes a light-emitting diode (LED) driven by the output signal.

A communication system that includes the RF power limiter is also disclosed. In one or more embodiments, the communication system includes a receiver, an antenna configured to detect wireless signals for the receiver, and one or more RF power limiters coupled between the antenna and the receiver. In embodiments, a RF power limiter of the one or more RF power limiters includes an input DC block, an output DC block, a limiter diode, a RF choke, and a test diode. A first terminal of the limiter diode is coupled to a node between the input DC block and the output DC block, and a second terminal of the limiter diode is coupled to an electrical ground. A first terminal of the RF choke is coupled to the node between the input DC block and the output DC block so that the first terminal of the RF choke is coupled to the first terminal of the limiter diode. A first terminal of the test diode is coupled to the second terminal of the RF choke, and a second terminal of the test diode is coupled to the electrical ground.

In some embodiments of the communication system, the input DC block includes at least one input capacitor, and the output DC block includes at least one output capacitor.

In some embodiments of the communication system, the limiter diode is a PIN diode.

In some embodiments of the communication system, the RF choke includes at least one inductor.

In some embodiments of the communication system, the test diode is a Schottky diode.

In some embodiments of the communication system, a forward voltage of the test diode is indicative of whether current is flowing through the limiter diode.

In some embodiments of the communication system, the RF power limiter further includes a detection circuit configured to detect whether current is flowing through the limiter diode based on the forward voltage.

In some embodiments of the communication system, the detection circuit includes an ADC configured to quantize the forward voltage.

In some embodiments of the communication system, the detection circuit includes an operational amplifier configured to generate an output signal based on the forward voltage.

In some embodiments of the communication system, the detection circuit further includes a LED driven by the output signal.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
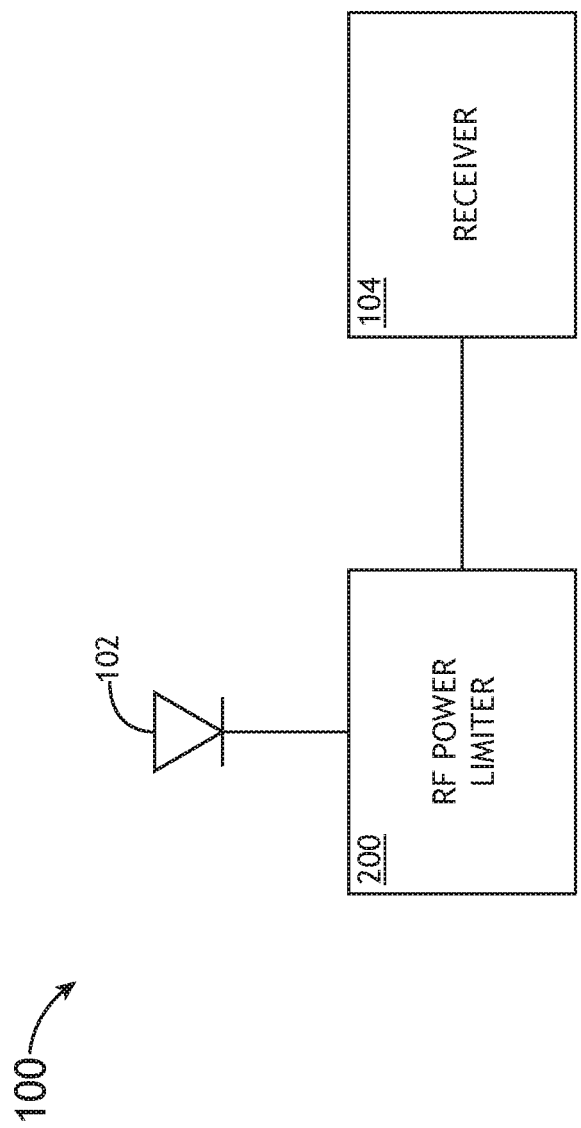
FIG. 1 is a schematic illustration of a communication system that includes a radio frequency (RF) power limiter with built-in test (BIT) circuitry, in accordance with one or more embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

A radio frequency (RF) transmission system may employ a RF power limiter to control (limit) power of RF signals propagated through the system. The RF power limiter may do so by reflecting back signals that exceed a threshold RF power level.

The limiter diode limits the power transmitted once RF power reaches a certain threshold and the diode begins conducting. However, as RF power incident to the limiter diode (e.g., a PIN diode) increases, the voltage waveform will exceed the forward voltage of the limiter diode causing it to short to ground. This short will begin to reflect power above a certain threshold. In order for Kirchhoff's law to be satisfied, an RF choke is needed so the current has somewhere to flow from.

RF power limiters are difficult to test because of their DC characteristics. For example, in a RF power limiter it may be impossible to directly test the limiter diode because it is DC grounded at both ends. One option is to add switches (e.g., transistors) to turn on/off a bias to see if current will flow through the limiter diode, but at that point the built-in test (BIT) circuit would potentially take up more space than the RF power limiter itself. Adding multiple stages for high power limiters compounds the problem even more.

FIG. 1 is a schematic illustration of a communication system 100 that includes a radio frequency (RF) power limiter 200 with built-in test (BIT) circuitry, in accordance with one or more embodiments of this disclosure. In embodiments, the communication system 100 includes a RF power limiter 200. For example, the communication system 100 may include an RF power limiter 200 coupled between a receiver 104 (e.g., a wireless receiver/transceiver) and an antenna 102 that is configured to detect wireless signals for the receiver 104.

Figure 2A:
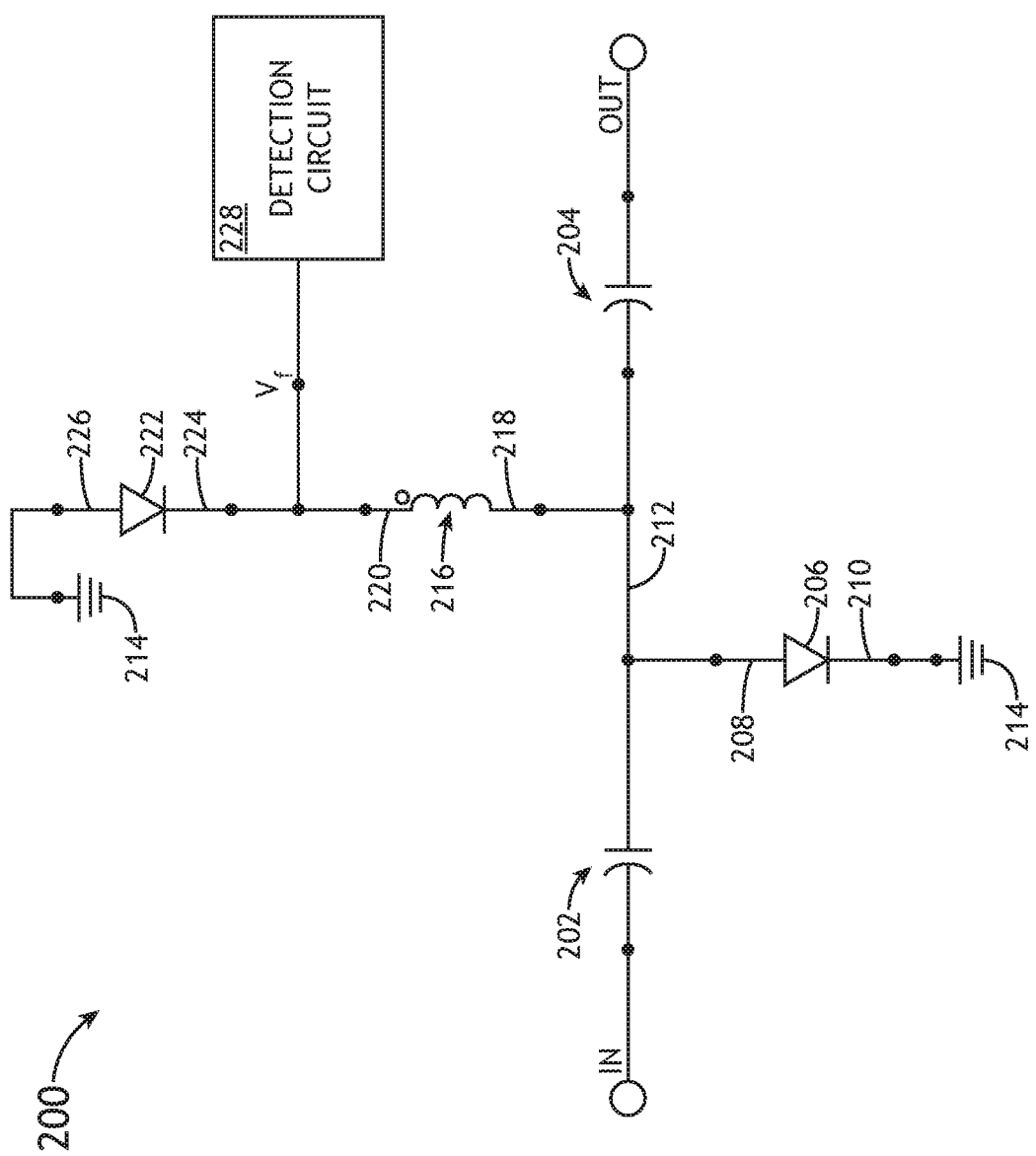
FIG. 2A is a schematic illustration of a RF power limiter with BIT circuitry, in accordance with one or more embodiments of this disclosure.
Figure 2B:
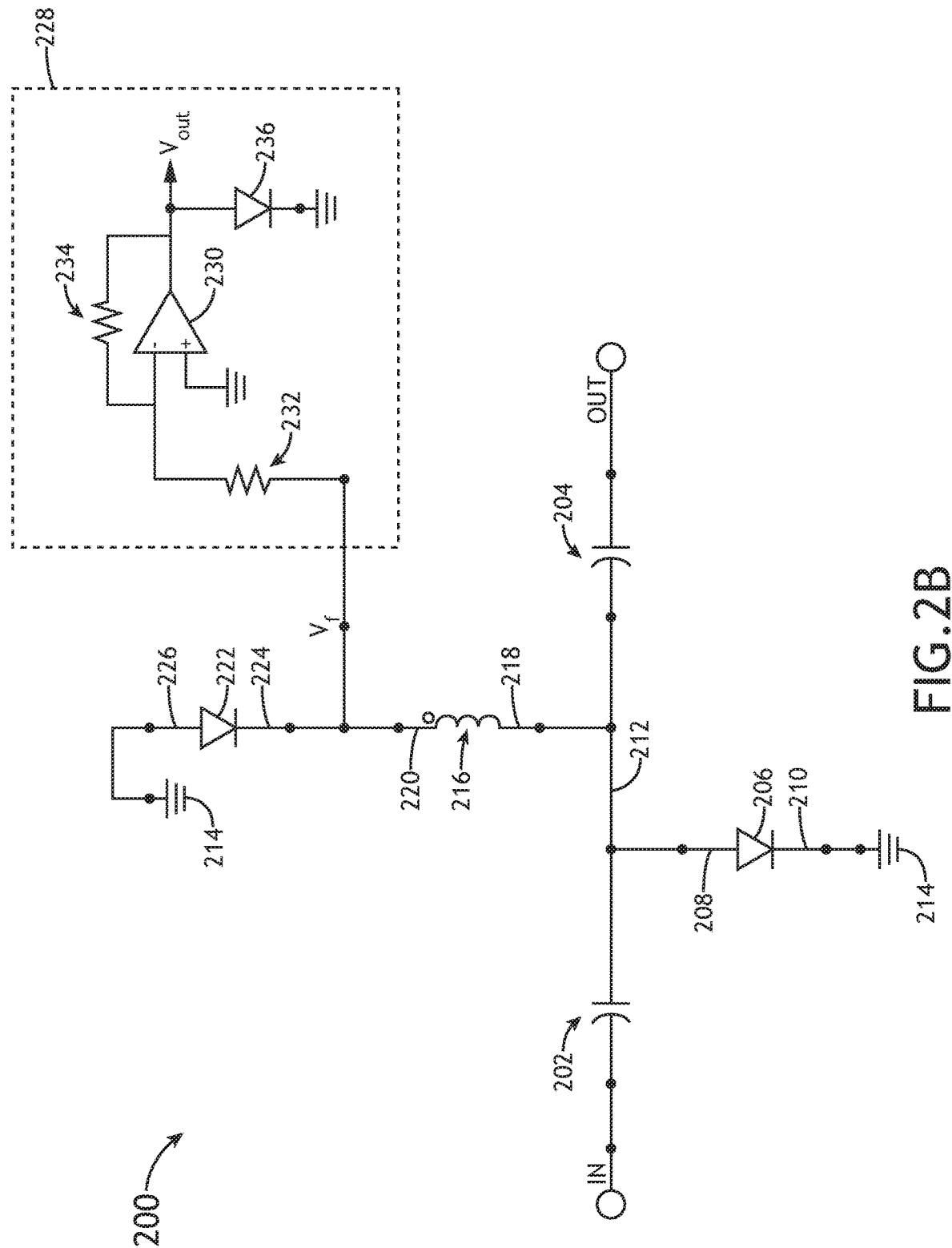
FIG. 2B is a schematic illustration of a RF power limiter with BIT circuitry, in accordance with one or more embodiments of this disclosure.
Figure 2C:
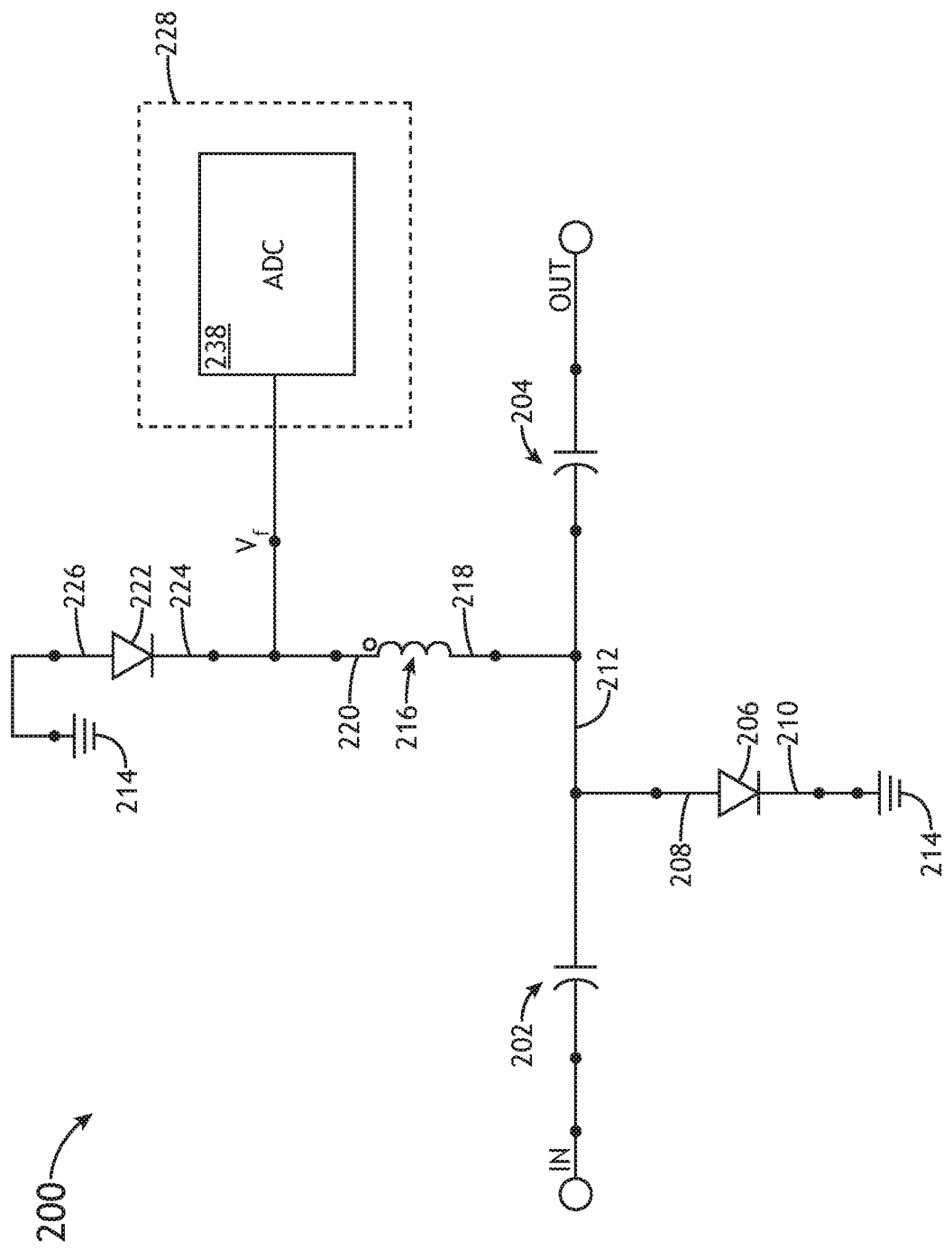
FIG. 2C is a schematic illustration of a RF power limiter with BIT circuitry, in accordance with one or more embodiments of this disclosure.

FIGS. 2A through 2C are schematic illustrations of various embodiments of the RF power limiter 200 with BIT circuitry. In embodiments, the RF power limiter 200 includes an input direct current (DC) block 202. The RF power limiter 200 further includes an output DC block 204. In some embodiments, the input DC block 202 includes at least one input capacitor, and the output DC block 204 includes at least one output capacitor.

The RF power limiter 200 further includes a limiter diode 206 having a first terminal 208 and a second terminal 210. The first terminal 208 of the limiter diode 206 may be coupled to a node 212 between the input DC block 202 and the output DC block 204. The second terminal 210 of the limiter diode 206 may be coupled to an electrical ground 214. The limiter diode 206 may be any type of limiter diode known in the art. For example, in embodiments, the limiter diode 206 may be a PIN diode.

The RF power limiter 200 further includes a RF choke 216 having a first terminal 218 and a second terminal 220. The first terminal 218 may be coupled to the node 212 between the input DC block 202 and the output DC block 204 such that the first terminal 218 of the RF choke 216 is coupled to the first terminal 208 of the limiter diode 206. The RF choke may be any type of RF choke known in the art. For example, in embodiments, the RF choke 216 may include at least one inductor.

The RF power limiter 200 further includes a test diode 222 having a first terminal 224 and a second terminal 226. The first terminal 224 of the test diode 222 may be coupled to the second terminal 220 of the RF choke 216. The second terminal 226 of the test diode 222 may be coupled to the electrical ground 214. The test diode 222 may be any type of test diode 222 known in the art. For example, in embodiments, the test diode 222 may be a Schottky diode.

When the RF power limiter 200 begins limiting current flow via the limiter diode 206, the current will flow through the limiter diode 206 as well as the test diode 222. The RF choke 216 may be configured to ensure a constant current through the limiter diode 206 and the test diode 222. A forward voltage ($V_f$) from the test diode 222 may be detected to determine if the limiter diode 206 is limiting current flow and/or how much current is flowing through the limiter diode 206. For example, the RF power limiter 200 may include a detection circuit 228. The detection circuit 228 may be configured to detect whether current is flowing through the limiter diode 206 and/or how much current is flowing through the limiter diode 206 based on the forward voltage ($V_f$).

In some embodiments, such as the embodiment illustrated in FIG. 2B, the detection circuit 228 may include an operational amplifier 230 configured to generate an output signal ($V_{out}$) based on the forward voltage ($V_f$). The operational amplifier 230 may be configured to detect the forward voltage ($V_f$) of the test diode 222 to determine/indicate whether or not the limiter diode 206 (e.g., PIN diode) is working and how much power the limiter diode 206 is actively limiting. In embodiments, the operational amplifier 230 may be coupled to resistors 232 and 234 that scale the forward voltage ($V_f$) to generate the output signal ($V_{out}$). For example, resistor 232 may be coupled to an input of the operational amplifier 230 and the output terminal 224 of the test diode 222, and resistor 234 may be coupled to the same input of the operational amplifier 230 and also to the output of the operational amplifier 230 so that the forward voltage ($V_f$) of the test diode 222 is fed into the operational amplifier 230 via resistor 232 and the output signal ($V_{out}$) is fed back into the operational amplifier 230 via resistor 234.

As shown in FIG. 2B, the detection circuit 228 may further include one or more light-emitting diodes (LEDs) 236 driven by the output signal ($V_{out}$). The output signal ($V_{out}$) may drive the LED 236 so that the LED 236 is turned on to indicate that current is flowing through the limiter diode 206. In some embodiments, the brightness of the LED 236 indicates how much current is flowing through the limiter diode 206. For example, the brighter the LED 236 the more power is being limited by the RF power limiter 200.

In some embodiments, such as the embodiment illustrated in FIG. 2C, the detection circuit 228 may include an analog-to-digital converter (ADC) 238. The ADC 238 may be configured to quantize the forward voltage ($V_f$). For example, the ADC 238 may be configured to convert the analog forward voltage ($V_f$) into a digital/discrete output. In embodiments, the ADC 238 may be communicatively coupled to a controller (e.g., a microcontroller, processor, ASIC, FPGA, or the like) that is configured to receive the digital/discrete output from the ADC 238 and provide the value to another device (e.g., user device) or present the digital/discrete output as a value or graphical representation via a user interface device (e.g., a display or the like). In embodiments, the ADC 238 may be configured to indicate that current is flowing through the limiter diode 206 when the digital/discrete output is greater than a predetermined threshold value. In some embodiments, the digital/discrete output of the ADC 238 is also indicative of how much current is flowing through the limiter diode 206. For example, the greater the digital/discrete output from the ADC the more power is being limited by the RF power limiter 200.

Figure 3:
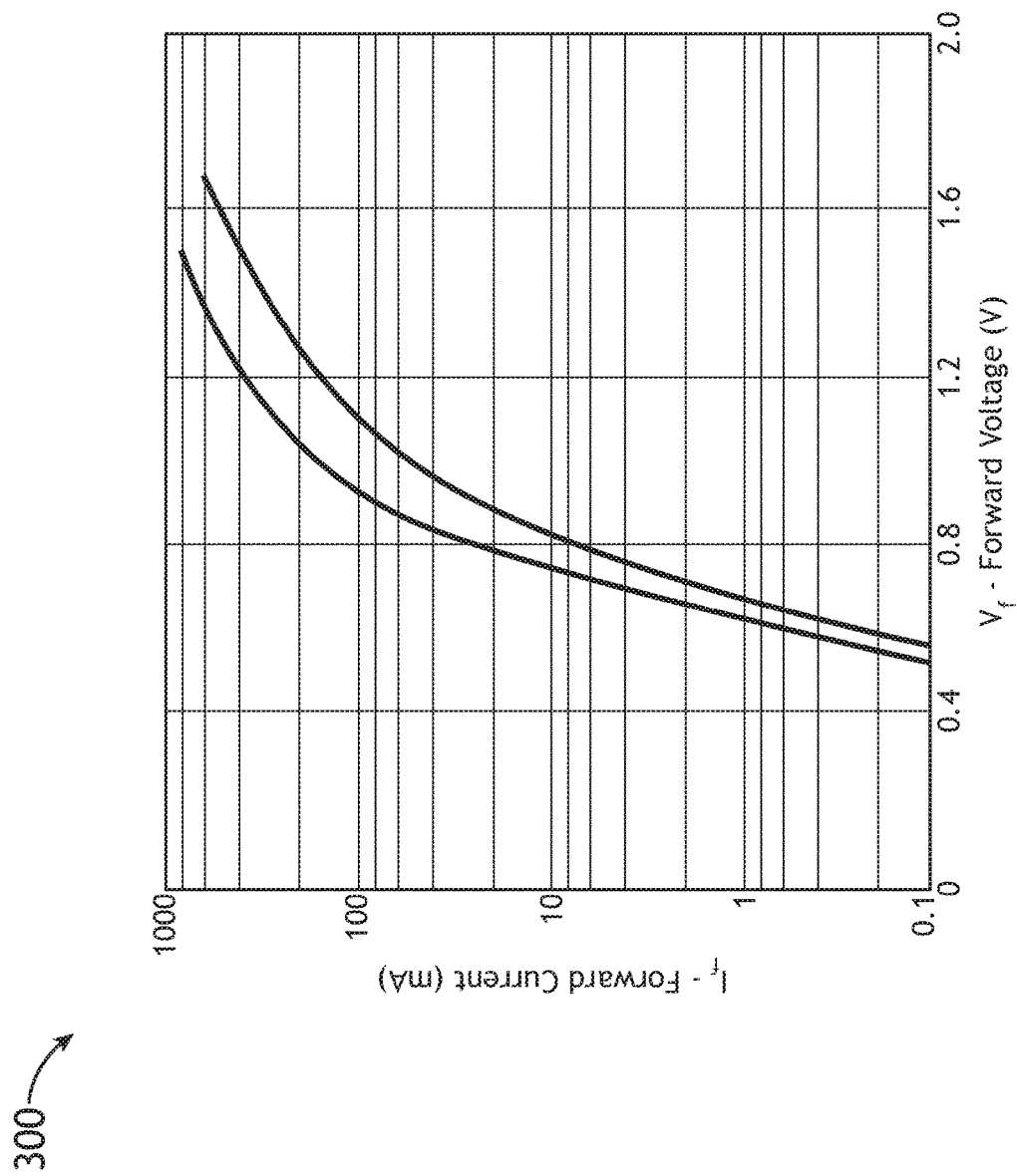
FIG. 3 is a graphical plot illustrating an example of forward voltage and forward current for a test diode, in accordance with one or more embodiments of this disclosure.

FIG. 3 is a graphical plot 300 illustrating an example of forward voltage ($V_f$) and forward current ($I_f$) for a test diode 222, in accordance with one or more embodiments of this disclosure. As illustrated by the graphical plot, the forward voltage ($V_f$) is directly proportional to the forward current ($I_f$). For example, as the forward voltage increases the forward current increases. By way of another example, as the forward voltage decreases the forward current decreases. The detection circuit 228 illustrated in FIGS. 2A through 2C may be configured to indicate a power level of the forward voltage ($V_f$) of the test diode 222 such that a user may determine the amount of current (forward current ($I_f$)) running through the RF power limiter 200.

Figure 4:
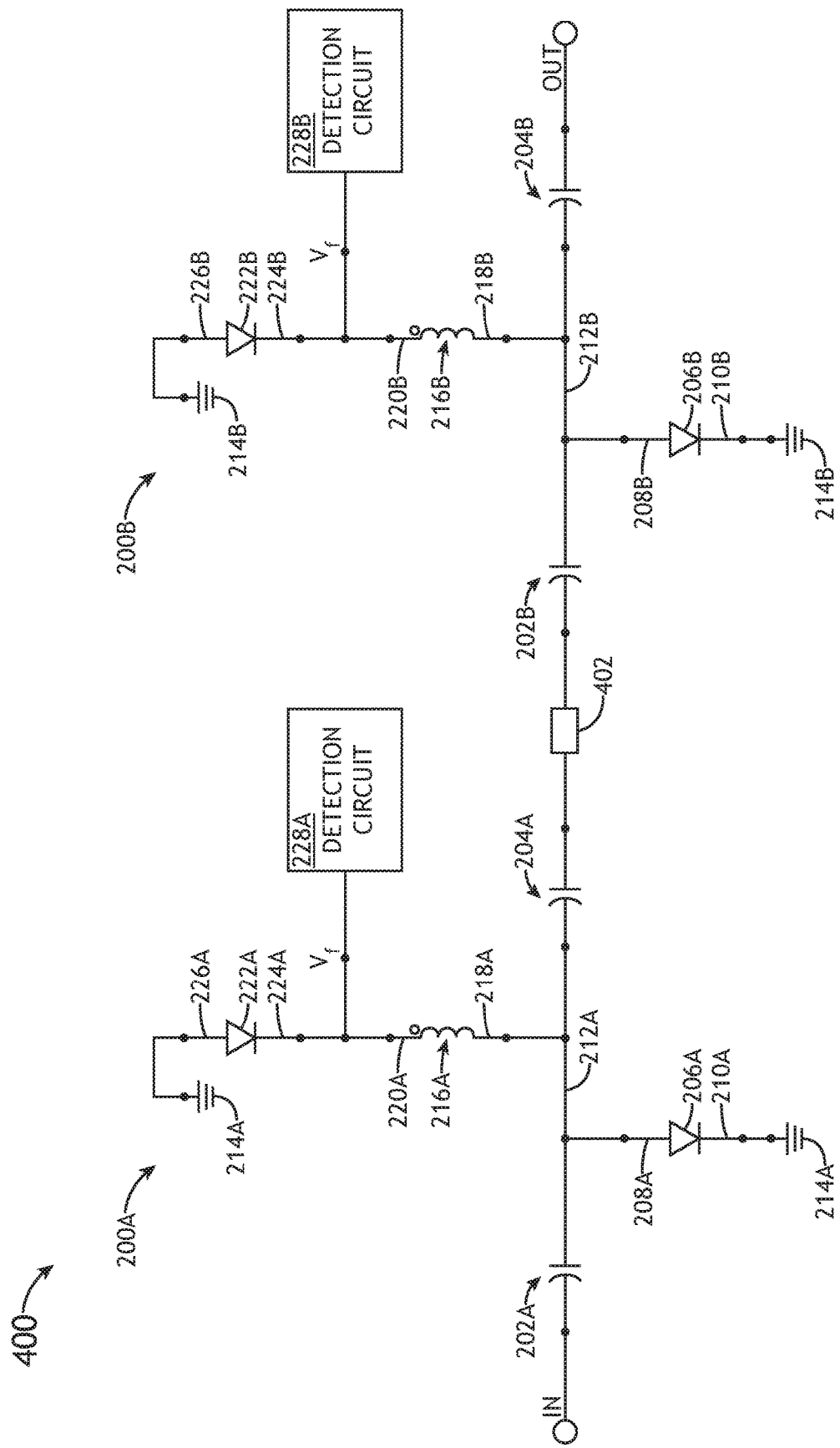
FIG. 4 is a schematic illustration of a multi-stage RF power limiter that includes a plurality of RF power limiters with BIT circuitry, in accordance with one or more embodiments of this disclosure.

FIG. 4 is a schematic illustration of a multi-stage RF power limiter 400 that includes a plurality of RF power limiters 200A, 200B with BIT circuitry, in accordance with one or more embodiments of this disclosure. Referring to both FIGS. 1 and 4, in some embodiments, the communication system 100 may include a plurality of RF power limiters 200A, 200B. For example, the RF power limiter 200 in FIG. 1 may be replaced by a multi-stage RF power limiter 400 made up of a plurality of RF power limiters 200A, 200B. In embodiments, a first RF power limiter 200A may be coupled to an additional RF power limiter 200B via a transmission line 402, and so on. It is contemplated that the multi-stage RF power limiter 400 may include any number of RF power limiters 200. For example, the multi-stage RF power limiter 400 may include two, three, four, or more RF power limiters 200, wherein each RF power limiter 200 is coupled to the next RF power limiter directly or via one or more transmission lines 402 (e.g., coaxial cables, coaxial couplers, wires, printed board traces, or the like).

Various embodiments of a RF power limiter 200/400 with BIT circuitry have been described with reference to FIGS. 1 through 4. However, in other embodiments, the RF power limiter 200/400 may be modified without deviating from the scope of this disclosure. For example, any of the components (e.g., resistors, capacitors, inductors, diodes, etc.) described herein may be implemented by a plurality of components. In this regard, any reference to "a" component should be understood as a reference to "one or more" of the same component.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A radio frequency (RF) power limiter, comprising:
   an input direct current (DC) block;
   an output DC block;
   a limiter diode having a first terminal and a second terminal, the first terminal of the limiter diode being coupled to a node between the input DC block and the output DC block, and the second terminal of the limiter diode being coupled to an electrical ground;
   a RF choke having a first terminal and a second terminal, the first terminal of the RF choke being coupled to the node between the input DC block and the output DC block so that the first terminal of the RF choke is coupled to the first terminal of the limiter diode;
   a test diode having a first terminal and a second terminal, wherein the first terminal of the test diode is coupled to the second terminal of the RF choke, the second terminal of the test diode is coupled to the electrical ground, and a forward voltage of the test diode is indicative of whether current is flowing through the limiter diode; and
   a detection circuit configured to detect whether current is flowing through the limiter diode based on the forward voltage.

2. The RF power limiter of claim 1, wherein the input DC block comprises at least one input capacitor, and the output DC block comprises at least one output capacitor.

3. The RF power limiter of claim 1, wherein the limiter diode comprises a PIN diode.

4. The RF power limiter of claim 1, wherein the RF choke comprises at least one inductor.

5. The RF power limiter of claim 1, wherein the test diode comprises a Schottky diode.

6. The RF power limiter of claim 1, wherein the detection circuit includes an analog-to-digital converter (ADC) configured to quantize the forward voltage.

7. The RF power limiter of claim 1, wherein the detection circuit includes an operational amplifier configured to generate an output signal based on the forward voltage.

8. The RF power limiter of claim 7, wherein the detection circuit further includes a light-emitting diode (LED) driven by the output signal.

9. A communication system, comprising:
a receiver;
an antenna configured to detect wireless signals for the receiver; and
one or more radio frequency (RF) power limiters coupled between the antenna and the receiver, wherein a RF power limiter of the one or more RF power limiters includes:
an input direct current (DC) block;
an output DC block;
a limiter diode having a first terminal and a second terminal, the first terminal of the limiter diode being coupled to a node between the input DC block and the output DC block, and the second terminal of the limiter diode being coupled to an electrical ground;
a RF choke having a first terminal and a second terminal, the first terminal of the RF choke being coupled to the node between the input DC block and the output DC block so that the first terminal of the RF choke is coupled to the first terminal of the limiter diode;
a test diode having a first terminal and a second terminal, wherein the first terminal of the test diode is coupled to the second terminal of the RF choke, the second terminal of the test diode is coupled to the electrical ground, and a forward voltage of the test diode is indicative of whether current is flowing through the limiter diode; and
a detection circuit configured to detect whether current is flowing through the limiter diode based on the forward voltage.

10. The communication system of claim 9, wherein the input DC block comprises at least one input capacitor, and the output DC block comprises at least one output capacitor.

11. The communication system of claim 9, wherein the limiter diode comprises a PIN diode.

12. The communication system of claim 9, wherein the RF choke comprises at least one inductor.

13. The communication system of claim 9, wherein the test diode comprises a Schottky diode.

14. The communication system of claim 9, wherein the detection circuit includes an analog-to-digital converter (ADC) configured to quantize the forward voltage.

15. The communication system of claim 9, wherein the detection circuit includes an operational amplifier configured to generate an output signal based on the forward voltage.

16. The communication system of claim 15, wherein the detection circuit further includes a light-emitting diode (LED) driven by the output signal.

* * * * *